United States Patent
Masuda et al.

(10) Patent No.: US 6,678,143 B2
(45) Date of Patent: Jan. 13, 2004

(54) ELECTROSTATIC CHUCK AND METHOD OF MANUFACTURING THE SAME

(75) Inventors: Shinsuke Masuda, Hyougo (JP); Kiyotoshi Fujii, Hyougo (JP)

(73) Assignee: General Electric Company, Pittsfield, MA (US)

( * ) Notice: Subject to any disclaimer, the term of this patent is extended or adjusted under 35 U.S.C. 154(b) by 92 days.

(21) Appl. No.: 10/006,657

(22) Filed: Dec. 10, 2001

(65) Prior Publication Data

US 2002/0109955 A1 Aug. 15, 2002

(30) Foreign Application Priority Data

Dec. 11, 2000 (JP) ..................................... 2000-376599
May 1, 2001 (JP) ..................................... 2001-134121
May 1, 2001 (JP) ..................................... 2001-134122

(51) Int. Cl.$^7$ .............................................. H01R 43/00
(52) U.S. Cl. ......................................... 361/234; 29/825
(58) Field of Search .......................... 219/542; 29/611, 29/825, 829, 830; 361/234, 233; 269/903; 279/128; 338/303–308, 323

(56) References Cited

U.S. PATENT DOCUMENTS

| | | | | | |
|---|---|---|---|---|---|
| 5,151,845 | A | * | 9/1992 | Watanabe et al. | 361/234 |
| 5,663,865 | A | * | 9/1997 | Kawada et al. | 361/234 |
| 5,748,436 | A | * | 5/1998 | Honma et al. | 361/234 |
| 5,777,543 | A | * | 7/1998 | Aida et al. | 338/308 |

* cited by examiner

Primary Examiner—Pia Tibbits (57) ABSTRACT

Disclosed is an electrostatic chuck having a coating layer (3) surrounding an insulating layer (1,2) and the eletrodes (3) consists essentially of non-crystalline carbon (DLC) having electric resistivity ranging from 10 sup 8 to 10 sup 13 Ω-cm. The coating layer preferably contains 15–26 atom % of hydrogen. The coating layer preferably has an intensity ratio of 07–1.2, the intensity ratio being defined as a ratio of an intensity at 1360 cm$^{-1}$ to another intensity at 1500 cm$^{-1}$ when the said coating layer is subjected to Raman spectroscopic analysis. The coating layer is manufactured by the P-CVD process wherein hydrocarbon (CxHy) is introduced into a vacuum container and ionized therein by ionizing process and ionized hydrocarbon is deposited on the surface of the said conductive electrodes by apply thereto a predetermined pulse voltage within an after-glow time of smaller than 250 microseconds.

20 Claims, 3 Drawing Sheets

ELECTROSTATIC CHUCK AND METHOD OF MANUFACTURING THE SAME

BACKGROUND OF THE INVENTION

Field of the Invention

The present invention relates to an electrostatic chuck particularly for use as a clamping device in a processing or manufacturing process of semiconductor wafer, flat panel display (FPD) and other materials (glass, aluminum, high polymer substances, etc.) for various electronic devices.

Figure 1:
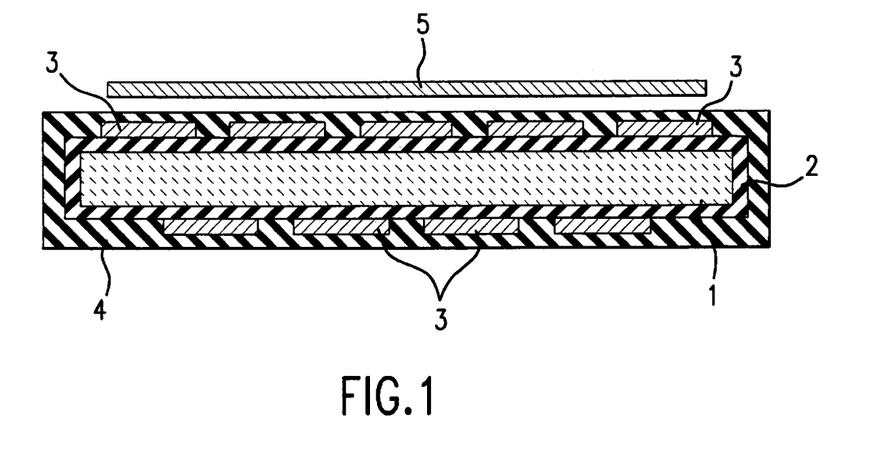
FIG. 1 is a diagrammatic cross-sectional view showing a bipolar ESC to which the present invention is applicable.

Electrostatic chucks have widely been used to support a silicon wafer or other workpiece in a station position during procession of the workpiece in filming processes such as chemical vapor deposition (CVD), physical vapor deposition (PVD), dry etching, etc. A typical example of the electrostatic chuck is shown in FIG. 1, which comprises a chuck body of graphite substrate 1 surrounded by an insulator 2 of pyrolytic boron nitride (PBN) or other insulating material, electrodes 3 of pyrolytic graphite (PG) or other conductive material superimposed upon or imbedded within the chuck body in a predetermined pattern, and an insulating separator or coating layer 4 surrounding the chuck body for separating the conductive electrodes 3 from the workpiece. Another construction of the electrostatic chuck comprises a ceramic substrate such as oxides and nitrides, conductive electrodes of molybdenum (Mo), Tantalum ala), tungsten (W) or any other metal having a high-melting point, ad DLC Diamond like carbon) coating layer surrounding the chuck body. Although not shown in FIG. 1, opposite ends of the electrodes 3 are respectively connected to terminals, which in turn are connected to a power source.

When a silicon wafer or other workpiece 5 is placed on an upper surface (a chucking surface) of the chuck of FIG. 1 and a source of voltage is applied across the electrodes to generate a Coulomb force, the workpiece 5 is electrostatically attracted or clamped to the chucking surface. In this arrangement, the electrostatic chuck also serves as a heater for uniformly heating the workpiece 5 to a temperature at which an optimum filing operation should be expected.

The electrostatic chuck of FIG. 1 is of a bipolar type. When it is modified to a monopolar chuck, a single electrode is superimposed upon or imbedded within the chuck body and a chucking voltage is applied between the single electrode and the workpiece on the chucking surface.

Preferably, the coating 4 of the electrostatic chuck has an electrical resistivity of between 10 sup 8 and 10 sup 13 $\Omega$-cm ($10^8 \sim 10^{13}$ $\Omega$-cm). The coating 4 having such a range of the electrical resistivity allows a feeble current to pass through the over coating 4 and the workpiece 5, which greatly increases the chucking force as known in the art as the "Johnsen-Rahbek" effect. U.S. Pat. No. 5,748,436 issued May 5, 1998 to Honma et al., the disclosure of which is herein incorporated by reference, teaches that the coating is composed of a composition containing PBN and a carbon dopant in an amount above 0 wt. % and less than 3 wt. %, which assures that the separator has the above-described range of the electric resistivity. The carbon doping is effected by a chemical vapor deposition (CVD). A carbon-doped PBN coating 4 is formed by introducing a low pressure, thermal CVD furnace a hydrocarbon gas such as methane (carbon source), for example, as well as a reaction gas such as a mixture of boron trichloride and ammonia (BN source), for example, for codeposition of the over coating 4, so that some amount of carbon is doped into the over coating 4.

The coating 4 of the electrostatic chuck is required to have not only the above-described range of electric resistivity but also other important characteristics including surface smoothness, thin-film formability and wear-resistance. When the chuck should also serve as heater as shown FIG. 1, it should satisfy additional requirements for thermal conductivity, infrared permeability, etc.

Although the electrostatic chuck taught by the above-referenced U.S. patent satisfies most of these requirements, the carbon-loped PBN (C-PBN) constituting the coating has a crystal structure which would tend to be separated from the chuck body resulting in a degraded durability. During use, the crystalline C-PBN may produce particles. It is necessary to control the chemical reaction of plural gases (for example, boron trichloride and ammonia for producing a PBN compact, and methane for doping carbon into the PBN compact), but such control is very delicate, which makes it difficult to provide a definite range of the electric resistivity to the coating of the final products. The prior art technique has another problem that the coating thickness tends to be non-uniform, which requires surface grinding as a finishing process.

SUMMARY OF THE INVENTION

After thorough study and repeated experiments and tests, the inventors have found that a non-crystalline carbon, referred to as diamond-like carbon (DLC), is most preferable material of the coating of the electrostatic chuck, because DLC satisfies substantially all of the above-described requirements.

More particularly, DLC has been known as a kind of carbon isotope, having a mixture of a graphite structure (SP2) and a diamond structure (SP3). Accordingly, it is easy to control is electric resistivity within a range of between 10 sup 8 and 10 sup 13 $\Omega$-cm ($10^8 \sim 10^{13}$ $\Omega$-cm), which is higher than the electric resistivity of a conductive graphite of the order of between 10 sup −3 and lower than that of diamond, that is a well known insulating material, of between 10 sup 12 and 10 sup 16 $\Omega$-cm($10^{12} \sim 10^{16}$ $\Omega$-cm). DLC is a preferable material to use as a protective coating for the surface of an electric static chuck, because of its inherent material properties such as high hardness, surface smoothness, low coefficient of friction, wear-resistance and thin film formability In addition, DLC is a preferable material for thermal applications, because its superb thermal conductivity and infrared permeability.

DLC has been used as a surface hardening material for various machine parts and tools such as cutting tools, molds, etc. It has also been used as components in a processig or manufacturing process of hard discs, magnetic tapes for VTR (video tape recording) systems and some other electronic devices. As far as the inventors have been aware of, no prior art teaches applicability of DLC to the coating material of the electrostatic chuck.

Accordingly, it is the prime objective of the present invention to overcome the drawbacks and disadvantages of the prior art electrostatic chuck and provides a novel construction of the electrostatic chuck particularly suitable for use as a clamping device in semiconductor wafer processes such as PVD, CVD, etc. and in manufacturing processes of flat panel displays including liquid crystal.

To achieve this and other objectives, according to an aspects of the present invention, there is provided an electrostatic chuck (hereinafter called ESC) for electrostatically clamping a workpiece to the ESC comprising an insulating layer, at least one conductive electrode superimposed upon or imbedded within the insulating layer, a protective coating layer surrounding the insulating layer and the electrodes, and a source of voltage for generating chucking force adjacent to the workpiece so as to clamp the workpiece to a chucking surface of the ESC, wherein the surface protective coating layer consists essentially of non-crystalline carbon with electric resistivity ranging from 10 sup 8 to 10 sup 13 Ω-cm. Preferably, the coating layer has thickness of at least 2.5 micrometers. The coating layer is preferably formed by a plasma chemical vapor deposition (P-CVD) process. The coating layer preferably contains 15–26 atom % of hydrogen.

According to another aspect of the present invention, there is provided an ESC for electrostatically clamping a workpiece to the ESC comprising an insulating layer, at least one conductive electrode superimposed upon or imbedded within the said insulating layer, a coating layer surrounding the insulating layer and the electrodes, a surface protection layer at least formed on one surface of the coating layer and consisting essentially of non-crystalline carbon having electric resistivity ranging from 10 sup 8 to 10 sup 13 Ω-cm, and a source of voltage for generating chucking force adjacent to the workpiece so as to clamp the workpiece to a surface of the surface protection layer. The since protection layer preferably contains 15–26 atom % of hydrogen.

According to still another aspects of the present invention, there is provided an ESC for electrostatically clamping a workpiece to the ESC comprising an insulating layer, at least one conductive electrode superimposed upon or imbedded within the said insulating layer, a coating layer surrounding the said insulating layer and the said electrodes, and source of voltage for generating chucking force adjacent to the said workpiece so as to clamp the said workpiece to a chucking surface of the ESC, the said coating layer consisting essentially of non-crystalline carbon and having electric resistivity ranging from 10 sup 8 to 10 sup 13 Ω-cm, the said coating layer having an intensity ratio of 0.7–1.2, the said intensity ratio being defined as a ratio of an intensity at 1360 $cm^{-1}$ to another intensity at $1500 cm^{-1}$ when the said coating layer is subjected to Raman spectroscopic analysis. Preferably, the coating layer has thickness of at least 2.5 micrometers. The coating layer is preferably formed by a plasma chemical vapor deposition (P-CVD) process. The coating layer preferably contains 15–26 atom % of hydrogen.

According to still another aspect of the present invention, there is provided an ESC for electrostatically clamping a workpiece to the ESC comprising an insulating layer, at least one conductive electrode superimposed upon or imbedded within the said insulating layer, a coating layer surrounding the said insulating layer and the said electrodes, a surface protection layer formed on at least one surface of the said coating layer and consisting essentially of non-crystalline carbon and having electric resistivity ranging from 10 sup 8 to 10 sup 13 Ω-cm, and a source of voltage for generating chucking force adjacent to the said workpiece so as to clamp it to a surface of the said surface protection layer, the said surface protection layer having an intensity ratio of 0.7–1.2, the said intensity ratio being defined as a ratio of an intensity at $1360^{-1}$ cm to another intensity at $1500^{-1}$ when the said surface protection coating layer is subjected to Raman spectroscopic analysis. The surface protection layer preferably contains 15–26 atom % of hydrogen.

There is also provided a method of manufacturing an ESC comprising the steps of forming a predetermined pattern of conductive electrodes on at least one surface of an insulating layer, and subjecting a resulting product to a plasma chemical vapor deposition process wherein hydrocarbon (CxHy) of which (x) ranges 1–10 and (y) ranges 2–22 is introduced into a vacuum container and ionized therein by ionizing (plasma) process and ionized hydrocarbon is deposited on the surface of the said conductive electrodes by applying thereto a predetermined pulse voltage, so that the said conductive electrodes are coated with a coating layer consisting essentially of non-crystalline carbon and having electric resistivity ranging from 10 sup 8 to 10 sup 13 Ω-cm.

Another method of manufacturing an ESC is also provided which comprises the steps of forming a predetermined pattern of an conductive electrode on at least one surface or an insulating layer; and subjecting a resulting product to a plasma chemical vapor deposition process wherein hydrocarbon (CxHy) is introduced into a vacuum container and ionized therein by an ionizing (plasma) process and ionized hydrocarbon is deposited on the surface of the said conductive electrodes by applying thereto a pulse voltage ranging from −1kV to −20 kV, so that the said conductive electrodes are coated with a coating layer consisting essentially of non-crystalline carbon and having electric resistivity from 10 sup 8 to 10 sup 13 Ω-cm.

Still another method of manufacturing an ESC is also provided which comprises the steps of forming a predetermined pattern of conductive electrode on at least one surface of an insulating layer, and subjecting a resulting products to a plasma chemical vapor deposition process wherein hydrocarbon (CxHy) is introduced into a vacuum container and ionized therein by an ionizing (plasma) process and ionized hydrocarbon is deposited on the surface of the said conductive electrodes by applying thereto a predetermined pulse voltage within an after-glow time of smaller than 250 microseconds so that the said conductive electrodes are coated with a coating layer consisting essentially of non-crystalline carbon and having electric resistivity ranging from 10 sup 8 to 10 sup 13 Ω-cm.

Still another method of manufacturing an ESC is also provided which comprises the steps of forming a predetermined pattern of conductive electrodes on at least one surface of an insulating layer, and subjecting a resulting product to a plasma chemical vapor deposition process wherein hydrocarbon (CxHy) of which (x) ranges 1–10 and (y) ranges 2–22 is introduced into a vacuum container and ionized therein by an ion (plasma) process and ionized hydrocarbon is deposited on the surface of the said conductive electrodes by applying thereto a pulse voltage ranging from −1 kV to −20 kV within an after-glow time of smaller than 250 microseconds, so that the said conductive electrodes are coated with a coating layer consisting essentially of non-crystalline carbon and having electric resistivity from 10 sup 8 to 10 sup 13 Ω-cm.

Still another method of manufacturing an ESC is also provided which comprises the steps of forming a predetermined pattern of conductive electrodes on at least one surface of an insulating layer; coating the said conductive electrodes coated with an insulating coating layer; and subjecting a resulting product to a plasma chemical vapor deposition process wherein hydrocarbon (CxHy)of which (x) ranges 1–10 and (y) ranges 2–22 is introduced into a vacuum container and ionized therein by an ionizing (plasma) process and ionized hydrocarbon is deposited on the surface of the said coating layer by applying thereto a predetermined pulse voltage, so that the said coating layer is coated with a surface protection layer consisting essentially of non-crystalline carbon and having electric resistivity ranging from 10 sup 8 to 10 sup 13 Ω-cm.

Still another method of manufacturing an ESC is also provided which comprises the steps of forming a predetermined pattern of conductive electrodes on at least one surface of an insulating layer; coating the said conductive electrodes with a coating layer, and subjecting a resulting product to a plasma chemical vapor deposition process wherein hydrocarbon (CxHy) is introduced into a vacuum container and ionized therein by an ionizing (plasma) process and ionized hydrocarbon is deposited on the surface of the said conductive electrodes by applying thereto a pulse voltage ranging from −1 kV to −20 kV, so that the said coating layer is coated with a surface protection layer consisting essentially of non-crystalline carbon and having electric resistivity range from 10 sup 8 to 10 sup 13 Ω-cm.

Still another method of manufacturing an ESC is also provided which comprises the steps of forming a predetermined pattern of conductive electrodes on at least one surface of an insulating layer, coating the said the conductive electrodes with a coating layer; and subjecting a resulting product to a plasma chemical vapor deposition process wherein hydrocarbon (CxHy) is introduced into a vacuum container and ionized therein by an ionizing process and ionized hydrocarbon is deposited on the surface of the said coating layer by applying thereto a predetermined pulse voltage within an after-glow time of smaller than 250 microseconds, so that the said coating layer is coated with a surface protection layer consisting essentially of non-crystalline carbon and having electric resistivity ranging firm 10 sup 8 to 10 sup 13 Ω-cm.

Still another method of manufacturing an ESC is also provided which comprises the steps of forming a predetermined pattern of conductive electrodes on at least one surface of an insulating layer, coating the said conductive electrodes with a coating layer, and subjecting a resulting product to a plasma chemical vapor deposition process wherein hydrocarbon (CxHy) of which x ranges 1–10 and (y) ranges 2–22 is introduced into a vacuum container and ionized therein by an ionizing (plasma) process and ionized hydrocarbon is deposited on the surface of the said coating layer by applying thereto a pulse voltage ranging from −1 kV to −20 kV within an after-glow time of smaller than 250 microseconds, so that the said coating layer is coated with a surface protection layer consisting essentially of non-crystalline carbon and having electric resistivity from 10 sup 8 to 10 sup 13 Ω-cm.

BRIEF DESCRIPTION OF THE DRAWINGS

Other objectives and advantages of the present invention can be understood from the following description when read in conjunction with the accompanying drawing in which.

DETAILED DESCRIPTION OF THE PREFERRED EMBODIMENT

A preferred embodiment of the present invention will be described in reference to FIG. 1. As described before, an electrostatic chuck shown in FIG. 1 comprises a graphite substrate 1, a PBN insulator 2 surrounding the graphite substrate 1, conductive electrodes 3 superimposed upon or imbedded within a PBN insulator 2 surrounding the graphite substrate 1 and conductive electrodes 3, an insulating separator or coating 4 surrounding the PBN insulator 2 and electrodes 3, and a power souse of voltage (not shown) for applying a predetermined voltage between the opposite ends of the electrodes 3 so as to clamp a workpiece 5 to the chucking surface of the chuck. In an embodiment of the present invention, the coating 4 comprises DLC formed by a plasma chemical vapor deposition (P-CVD) process.

EXAMPLE 1

A 10 mm thick of graphite substrate was coated with 300 micrometers thick of a PBN film layer 2 by a chemical vapor deposition (CVD) process. 50 micrometer thick of a pyrolytic graphite PG) was applied onto the said PBN layer 2 also by a CVD process, which was then partly removed so that the remaining PG film layer forms predetermined patterns of conductive electrodes 3. Then, a coating layer 4 was deposited on the PBN layer 2 and electrodes 3 by a plasma CVD (P-CVD) process to produce an ESC (electrostatic chuck). In the P-CVD process in this example, pressure of the process system was reduced to $6 \times 10^{-3}$ Torr, a hydrogen gas (acetylene $C_2H_2$ in this case) was introduced into the system and a pulse voltage of −5000 V was applied to both the electrodes 3 and graphite substrate 1 for P-CVD operation. The electric resistivity of the coating 4 was measured and found to be approximately 10 sup 10 Ω-cm ($10^{10}$ -cm).
<Control 1>

For comparison, another ESC was manufactured in like manner as in manufacturing the electrostatic chuck of Example 1 except that the thickness of the DLC coating layer 4 was 2.0 micrometers.
<Control 2>

After preparing the substrate 1 with a PBN layer 2 and electrodes 3 on both surfaces thereof in like manner as in Example 1, a carbon-doped PBN coating layer 4 was formed to surround the PBN layer 2 and the electrodes 3 by a CVD process as taught by U.S. Pat. No. 5,606,484 to produce an ESC of Control 2. More specifically, the carbon-doped PBN coating layer 4 was formed by introducing a mixture gas consisting of boron trichloride ($BCl_3$), ammonia ($NH_3$) and methane ($CH_4$) at a mole ratio of 1:3:2.4 into a high vacuum thermal reaction chamber to cause a chemical reaction at a pressure of 0.5 Torr and at a temperature of 1850 degrees Celsius.

EXAMPLE 2

Figure 2:
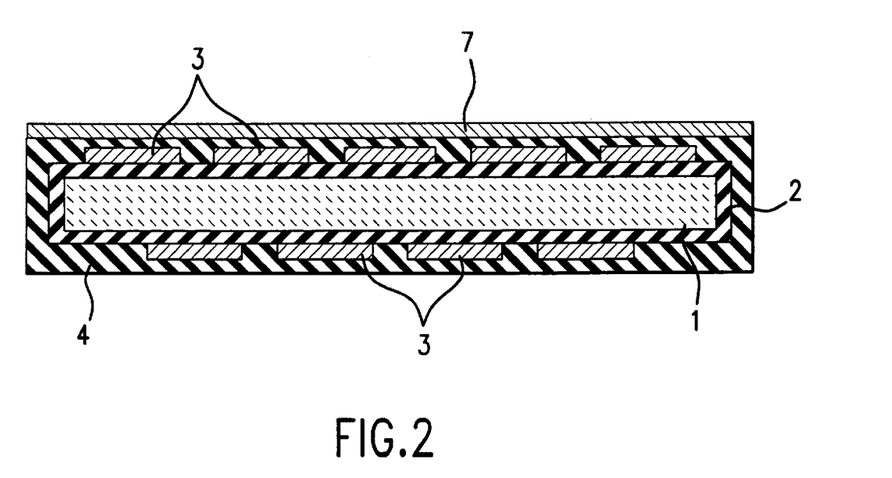
FIG. 2 is a diagrammatic cross-sectional view showing another construction of the bipolar ESC to which the present invention is also applicable.

The ESC of Control 2 was then subjected to a P-CVD process wherein an acetylene ($C_2H_2$) gas was reacted at a pulse voltage of −5000V which was applied to the electrodes, and at a pressure of $6 \times 10$ sup −3 Torr ($6 \times 10^{-3}$ Torr) to deposit a DLC surface protection layer 7, as shown in FIG. 2. The electric resistivity of the DLC surface protection layer 7 was measured and found to be approximately 10 sup 10 Ω-cm ($10^{10}$ Ω-cm).

Voltages of 1000V and 2000V were applied to the electrostatic chuck of Examples 1,2 and Controls 1,2 for dielectric breakdown tests. The ESC of Control 1 showed dielectric breakdown at 1000V voltage application to reduce its electric resistivity, by which the chucking force was reduced to below a practical level desired. The ESC of Example 1 showed no dielectric breakdown at 1000V voltage application.

When a dielectric strength is supposed to be 400000V/mm, the coating thickness which would not be dielectrically broken down by application of 1000V voltage is (1000×1000)/400000=2.5 micrometers. Accordingly, the thickness of the DLC coating 4 is preferably at least 2.5 micrometers.

Meanwhile, the chucking force is determined by the following equation according to the Coulomb's law:

$$F=(1/2)\cdot\epsilon\cdot(V/d)^2$$

Wherein F represents chucking force (g/cm²), between a workpiece and a chucking surface, $\epsilon$ a dielectric constant of the coating layer, d thickness (cm) of the coating layer and V a voltage applied.

The C-PBN coating layer must have a greater thickness. In fact, the C-PBN coating layer of the chuck of Control 2 has 150 micrometers thickness, as shown in Table I, which is much thicker than the DLC coating layer (of 2.5 micrometers thickness) of the ESC of Example 1. In order that the ESC of Control 2 provides a sufficient chucking force, a voltage to be applied should be increased to at least 2000V, as known from the above-referred equation.

The chuck of Control 2 showed ab marks and approximately 1 micrometer sized particles were generated thereby on the C-PBN coating layer after 70000 silicone wafers chunking operation. The chuck of Example 2 wherein the C-PBN coating layer is further coated with a surface protection layer of DLC showed an improved wear-resistance property, which is durable to the same 70000 chucking operation.

The construction of the ESC of Examples 1,2 and Controls 1,2 are shown in the following Table I, as well as the results of dielectric breakdown tests and wear-resistance tests.

TABLE I

|  | Example 1 | Control 1 | Control 2 | Example 2 |
|---|---|---|---|---|
| Coating Layer (Resistivity) | DLC 2.5$\mu$ ($10^{10}$ $\Omega$-cm) | DLC 2.0$\mu$ ($10^{10}$ $\Omega$-cm) | C-PBN 150$\mu$ ($10^{10}$ $\Omega$-cm) | C-PBN 150$\mu$ ($10^{10}$ $\Omega$-cm) |
| Surface Protection Layer (Resistivity) | None | None | None | DLC 1.0$\mu$ ($10^{10}$ $\Omega$-cm) |
| Dielectric Breakdown 1000 V 2000 V | No | Yes | No | No |
| Wear-Resistance | No Abrasive Marks Occurred |  | Abrasive Marks Occurred | No Abrasive Marks Occurred |

Formation of the DLC coatings of the ESCs of Example 1 and Control 1 and formation of the DLC surface protection layer of the chuck of Example 2 were all carried out by a plasma CVD (P-CVD) process. In the P-CVD process, a hydrocarbon gas such as acetylene and benzene is introduced into a vacuum container and subjected to high energy by using energy sources such as direct-current (DC) discharge and radio frequency (RF) employing high voltage pulse to ionize the hydrocarbon gas, which are electrically accelerated and deposited on a product to form a DLC coating or layer thereon. This P-CVD process is suitable for use in formation or DLC coating or layer in the present invention, because the DLC coating or layer formed by the P-CVD process would inevitably contain a small amount of hydrogen, which facilitates that the DLC coating layer 4 or the DLG surface protection layer 7 has a preferable range of electric resistivity of 10 sup 8 to 10 sup 13 $\Omega$-cm. Although another process, including a spattering process using a solid carbon source is also known as a process for formation of a DLC coating or layer, the DLC coating or layer formed by such a process contains no hydrogen.

To prove a favorable range of hydrogen content in the DLC coating layer 4, various ESCs were manufactured by changing process variables of the P-CVD process in Example 1, and the electric resistivity and hydrogen content of the resulting DLC coating layer 4 ware measured, the results of which are shown in the following Table II.

TABLE II

| No. | Pulse (-KV) | Gas | Flow Rate (sccm) | Pressure (Torr) | Resistivity ($\Omega$-cm) | H content (atom %) |
|---|---|---|---|---|---|---|
| 1 | 10 | $C_2H_2$ | 6 | $6 \times 10^{-3}$ | $3.3 \times 10^8$ | 25 |
| 2 | 10 | $C_2H_2$ | 6 | $6 \times 10^{-3}$ | $1.4 \times 10^9$ | 21 |
| 3 | 10 | $C_2H_2/H_2$ | 6/2 | $6 \times 10^{-3}$ | $1.9 \times 10^9$ | 23 |
| 4 | 10 | $C_2H_2/H_2$ | 6/6 | $6 \times 10^{-3}$ | $7.8 \times 10^8$ | 24 |
| 5 | 10 | $C_7H_8$ | 6 | $6 \times 10^{-3}$ | $1.7 \times 10^{11}$ | 21 |
| 6 | 10 | $C_7H_8$ | 6 | $6 \times 10^{-3}$ | $5.0 \times 10^{11}$ | 21 |
| 7 | 10 | $C_7H_8$ | 6 | $9 \times 10^{-3}$ | $1.7 \times 10^{12}$ | 18 |
| 8 | 10 | $C_7H_8$ | 9 | $6 \times 10^{-3}$ | $1.3 \times 10^{12}$ | 17 |
| 9 | 10 | $C_7H_8$ | 9 | $9 \times 10^{-3}$ | $3.3 \times 10^{11}$ | 17 |

The hydrogen content was measured by an ERD (elastic recoil detection) method wherein helium atoms (He) are accelerated and bombarded a specimen (that is the DLC coating layer 4 in this case) to count the number of hydrogen atoms (H) coming out of the specimen.

From the results shown in Table II, it may be confined that the electric resistivity of the DLC coating layer 4 decreases substantially proportion with increase of the hydrogen content. It is also demonstrated that the DLC coating layer 4 should have the hydrogen content ranging from 15 to 26 atom % in order to the electric resistivity ranging from 10 sup 8 to 10 sup 130 $\Omega$-cm.

Further tests and experiments have revealed that there is a correlation between electric resistivity of DLC and a ratio of intensities at 1360 cm$^{-1}$ and at 1500 cm$^{-1}$ which is obtained by Raman spectroscopic analysis of carbon structure of DLC. Raman spectroscopic analysis is a known technique to analyze a structure of a substance by irradiating the substance with a predetermined laser beam so that atoms in the substance oscillates or rotates to produce scattered light or Raman spectrum, intensity of which is measured.

Figure 3:
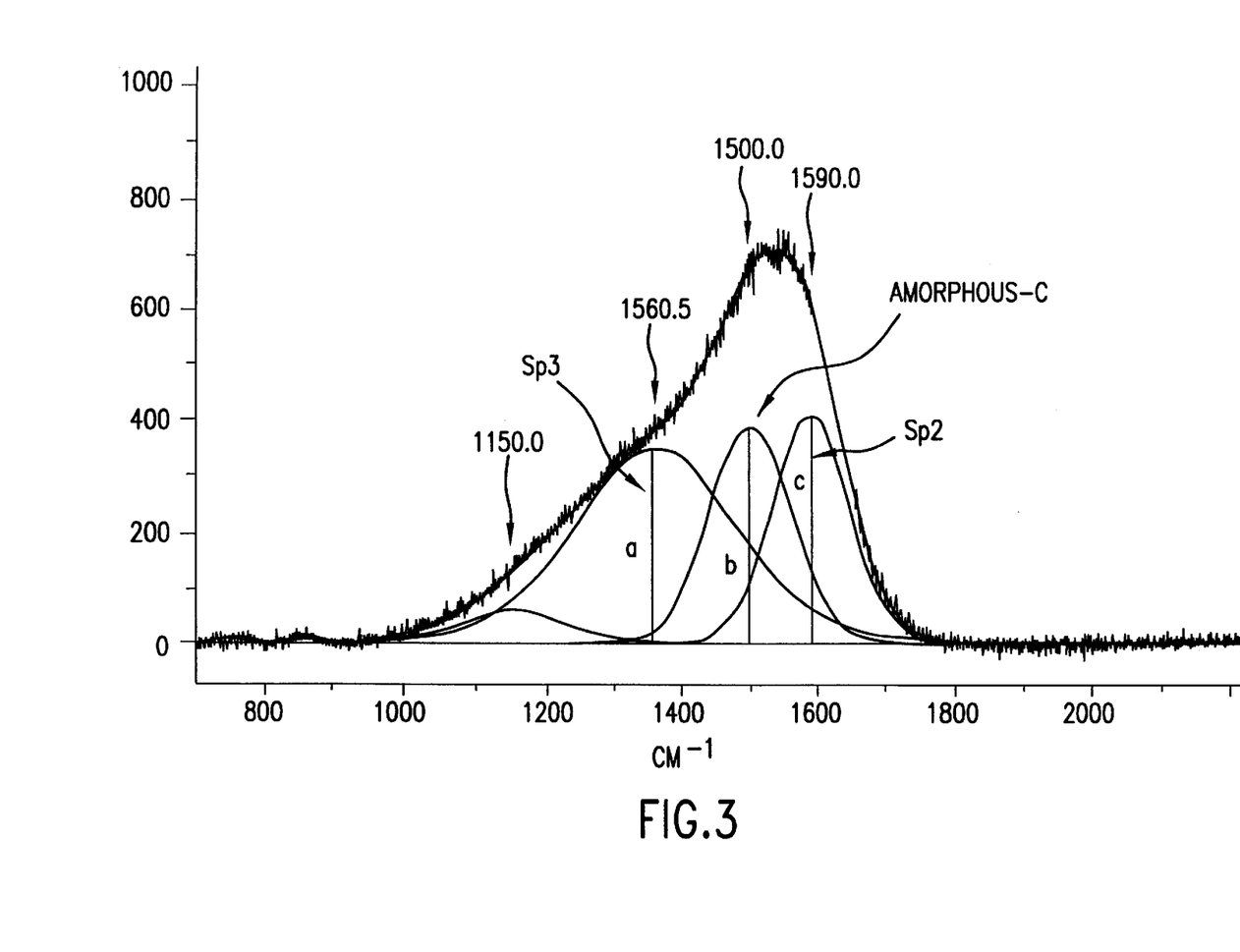
FIG. 3 is a chart showing the result of Roman spectroscopic analysis applied to DLC species.

An example of the results of Raman spectroscopic analysis of DLC species is shown in an intensity chart of FIG. 3 As described before, DLC structure is a mixture of a graphite structure (SP2) and a diamond structure (SP3) and, therefore, provides a hydrocarbon intensity peak at 1150 cm$^{-1}$ and a irregular graphite intensity peak at 1360 cm$^{-1}$, an amorphous carbon intensity peak at 1500 cm$^{-1}$ and a regular graphite intensity peak at 1590 cm$^{-1}$ in its intensity chart of Raman spectroscopic analysis. The inventors have fund that electric resistivity of DLC is greatly influenced by an intensity ratio of (b)/(a) ((a) is an irregular graphite intensity at 1360 cm$^1$ and (b) is an amorphous carbon intensity at 500cm$^{-1}$).

Samples 1–16 of ESCs of the construction of FIG. 1 have been manufactured by changing process variables in the P-CVD process to form DLC coating layer 4 in Example 1, as shown in the following Table III. The measured electric resistivity and the intensity ratio (b)/(a), stated above, in Raman spectroscopic analysis of the DLC coating layer 4 of each sample are shown in Table IV.

TABLE III

| No. | Pules Voltage (kV) | Gas | Flow Rate (sccm) | Pressure (Torr) |
|---|---|---|---|---|
| 1 | 10 | $C_2H_2$ | 6 | $6 \times 10^{-3}$ |
| 2 | 20 | $C_2H_2$ | 6 | $6 \times 10^{-3}$ |
| 3 | 10 | $C_2H_2$ | 6 | $6 \times 10^{-3}$ |
| 4 | 10 | $C_2H_2/H_2$ | 6/2 | $6 \times 10^{-3}$ |
| 5 | 10 | $C_2H_2/H_2$ | 6/4 | $6 \times 10^{-3}$ |
| 6 | 10 | $C_2H_2/H_2$ | 6/6 | $6 \times 10^{-3}$ |
| 7 | 10 | $C_2H_2/H_2$ | 6/50 | $6 \times 10^{-3}$ |
| 8 | 10 | $C_7H_6$ | 6 | $6 \times 10^{-3}$ |
| 9 | 10 | $C_7H_8/H_2$ | 4/6 | $6 \times 10^{-3}$ |
| 10 | 10 | $C_7H_6$ | 6 | $6 \times 10^{-3}$ |
| 11 | 10 | $C_7H_6$ | 6 | $6 \times 10^{-3}$ |
| 12 | 10 | $C_7H_8$ | 96 | $6 \times 10^{-3}$ |
| 13 | 10 | $C_7H_8$ | 9 | $6 \times 10^{-3}$ |
| 14 | 10 | $C_7H_8$ | 6 | $6 \times 10^{-3}$ |
| 15 | 10 | $C_7H_8$ | 6 | $6 \times 10^{-3}$ |
| 16 | 10 | $C_7H_8$ | 6 | $6 \times 10^{-3}$ |

TABLE IV

| | | Results of Raman Spectrum Analyses | | |
|---|---|---|---|---|
| No. | Resistivity ($\Omega$-cm) | Intensity at $1360\ cm^{-1}$ | Intensity at $1500\ cm^{-1}$ | Intensity Ratio |
| 1 | $3.3 \times 10^9$ | $5.43 \times 10^2$ | $4.89 \times 10^2$ | 0.9006 |
| 2 | $1.0 \times 10^7$ | $3.34 \times 10^2$ | $2.16 \times 10^2$ | 0.6467 |
| 3 | $1.4 \times 10^9$ | $4.22 \times 10^2$ | $4.13 \times 10^2$ | 0.9787 |
| 4 | $1.9 \times 10^9$ | $5.33 \times 10^2$ | $4.93 \times 10^2$ | 0.9250 |
| 5 | $2.5 \times 10^9$ | $4.92 \times 10^2$ | $4.85 \times 10^2$ | 0.9858 |
| 6 | $7.8 \times 10^8$ | $4.97 \times 10^2$ | $4.57 \times 10^2$ | 0.9195 |
| 7 | $5.3 \times 10^9$ | $6.97 \times 10^2$ | $5.47 \times 10^2$ | 0.7848 |
| 8 | $1.7 \times 10^{11}$ | $4.22 \times 10^2$ | $4.41 \times 10^2$ | 1.0450 |
| 9 | $8.3 \times 10^{10}$ | $3.66 \times 10^2$ | $3.90 \times 10^2$ | 1.0656 |
| 10 | $5.0 \times 10^{11}$ | $3.71 \times 10^2$ | $3.85 \times 10^2$ | 1.0369 |
| 11 | $1.7 \times 10^{12}$ | $3.34 \times 10^2$ | $3.44 \times 10^2$ | 1.0313 |
| 12 | $1.3 \times 10^{12}$ | $3.47 \times 10^2$ | $3.81 \times 10^2$ | 1.0967 |
| 13 | $3.3 \times 10^{11}$ | $3.77 \times 10^2$ | $4.14 \times 10^2$ | 1.0982 |
| 14 | $9.6 \times 10^{10}$ | $3.30 \times 10^2$ | $3.51 \times 10^2$ | 1.0626 |
| 15 | $1.0 \times 10^{12}$ | $3.57 \times 10^2$ | $3.98 \times 10^2$ | 1.1158 |
| 16 | $1.3 \times 10^{11}$ | $2.94 \times 10^2$ | $2.92 \times 10^2$ | 0.9932 |

As shown, it has been known that there is a correlation such that the electric resistivity of DLC coating layer 4 increases substantially in proportion to the intensity ratio (b)/(a) in Raman spectroscopic analysis. More specifically, it has been confirmed that DLC coating layer 4 should have the intensity ratio (b)/(a) in Raman spectroscopic analysis of 0.7–1.2 in order to provide the electric resistivity ranging from 10 sup 8 to 10 sup 13 $\Omega$-cm.

<Experiments 1>

Figure 4:
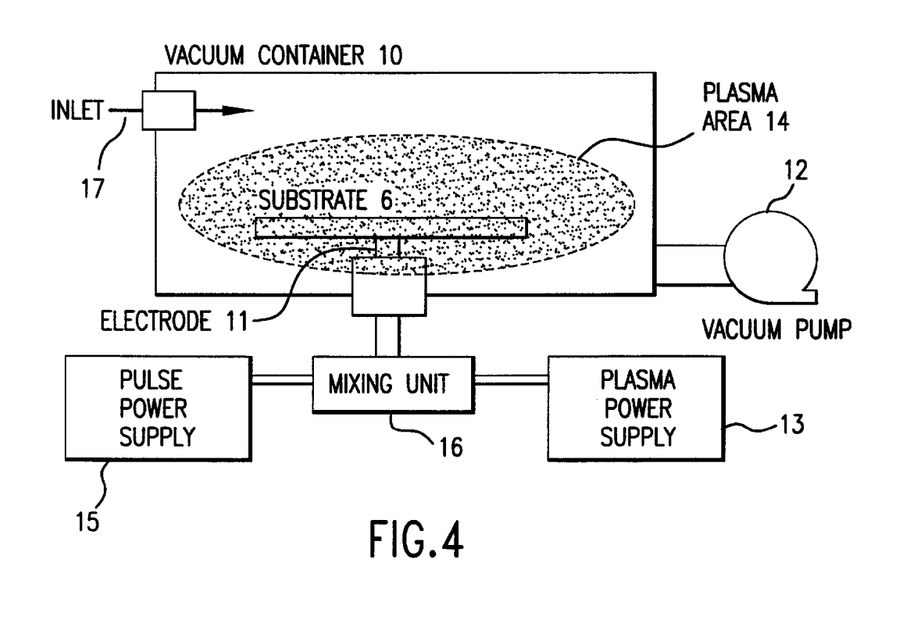
FIG. 4 shows a principle of plasma chemical vapor deposition (P-CVD) process by which the coating layer and/or source protection layer is formed according to the present invention.
Figure 5:
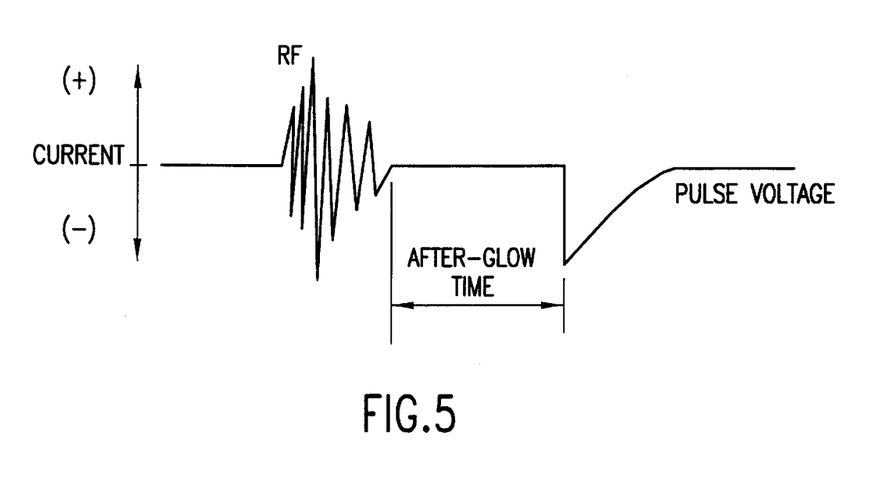
FIG. 5 is a timing chart of application of plasma and pulse voltage in the plasma CVD process of FIG. 4.

After preparing the intermediate having the graphite compact 1, PBN insulating layer 2 and the electrodes 3 on both surfaces thereof in like manner as in Example 1, coating layers 4 were formed to surround the PBN film layer 2 and the electrodes 3 by a P-CVD process to produce an ESC wherein various hydrocarbon compounds were used as a plasma source in the P-CVD process. Referring specifically to FIG. 3 and FIG. 4, in a P-CVD process, a substrate 6 (on which a DLC coating layer 4 should be deposited) is placed on an electrode 11 in a vacuum container 10, which is maintained in a reduced internal pressure condition by a vacuum pump 12, and a hydrocarbon compound (CxHy) in gaseous, liquid or solid condition is introduced into the container 10 through an inlet 17. A radio frequency (RF) voltage is applied from a plasma power source 13 via a mixing unit 16 to the substrate 6 to form a plasma area 14 therearound, which facilitates ionization of the introduced hydrocarbon. After a predetermined after-glow time (which means a period of time after application of a plasma RF voltage is completed and before application of a pulse voltage commences), a predetermined pulse voltage supplied from a pulse power source 15 is applied via the mixing unit 16 to the substrate 6, so that the ionized hydrocarbon is electrically accelerated and deposited upon the surface of the substrate as DLC coating layer 4. In the experiments, the internal pressure of the vacuum container 10 was controlled to be 6–9×$10^{-3}$ Torr and the gas flow rate was 6 sccm. The electric resistivity of the DLC coating layers 4 of the resulting ESCs were measured, the results of which are shown in the following Table V.

TABLE V

| | Methane ($CH_4$) | Acetylene ($C_2H_4$) | toluene ($C_7H_8$) | xylene ($C_8H_{10}$) | decane ($C_{10}H_{22}$) |
|---|---|---|---|---|---|
| Resistivity ($\Omega$-cm) | $1.5 \times 10^8$ | $1.4 \times 10^9$ | $1.3 \times 10^{11}$ | $5.3 \times 10^{12}$ | $1.7 \times 10^{13}$ |
| Intensity Ratio | 0.8747 | 0.9787 | 1.0625 | 1.1202 | 1.1751 |

As shown in Table V, the electric resistivity of DLC coating layers 4 were all within favorable range, that is from 10 sup 8 to 10 sup 13 $\Omega$-cm. The results also suggest that the electric resistivity of DLC coating layer formed by P-CVD process correlates with molecular weight of hydrocarbon compound introduced to the vacuum container 10. In addition, the electric resistivity of DLC coating layer which was formed by methane ($CH_4$) having the smallest molecular weight among the hydrocarbon compounds used in the experiments was almost approximate to the lower limit of the favorable range, whereas the electric resistivity of DLC coating layer formed by decane ($C_{10}H_{22}$) having the largest molecular weight was almost approximate to the upper limit of the favorable range. From these results, it has been found that a hydrocarbon compound (CxHy) of which (x) ranges 1–10 and (y) ranges 2–22 should be used in the PVD process in order to form DLC coating layer 4 having electric resistivity within the favorable range, that is from 10 sup 8 to 10 sup 13 $\Omega$-cm.

Table V also shows the intensity ratio (b)/(a), stated above, in Raman spectroscopic analysis of DLC coating layers 4 of the resulting ESCs. As described before, there is a correlation between electric resistivity of DLC coating layer and the DLC coating should have the intensity ratio (b)/(a) wherein (a) is an irregular graphite intensity peak at 1360 $cm^{-1}$ and (b) is an amorphous carbon intensity peak at 1500 $cm^{-1}$ in Raman spectroscopic analysis, and it has been confirmed that the intensity ratio (b)/(a) should be 0.7–1.2 in order to form a favorable DLC coating layer having the electric resistivity ranging from 10 sup 8 to 10 sup 13 $\Omega$-cm. As shown in Table V, each of DLC coating layers 4 of the resulting ESCs has the intensity ratio (b)/(a) of 0.7–12.

<Experiments 2>

Various ESCs were manufactured in like manner as in Experiments 1 except that toluene ($C_7H_6$) was introduced into the vacuum container 10 and the pulse voltage to be applied was varied within a range from −1 kV to −20 kV in the P-CVD process for deposition of DLC coating layers. The electric resistivity of the DLC coating layers 4 of the resulting ESCs were measured, the results of which are shown in the following Table VI.

TABLE VI

| Pulse Voltage | −1.0 kV | −2.0 kV | −5.0 kV | −10.0 kV | −15.0 kv | −20.0 kv |
|---|---|---|---|---|---|---|
| Resistivity ($\Omega$-cm) | $1.1 \times 10^{13}$ | $6.7 \times 10^{12}$ | $1.0 \times 10^{12}$ | $6.7 \times 10^{10}$ | $3.0 \times 10^{8}$ | $9.5 \times 10^{7}$ |

As shown in Table VI, the electric resistivity of DLC coating layers 4 were all within favorable range, that is from $10^8$ to $10^{13}$ $\Omega$-cm. The results also suggest that the electric resistivity of DLC coating layer formed by P-CVD process correlates with the pulse voltage applied from the power source 15 in the P-CVD process. Further, the electric resistivity of DLC coating layer which was formed when the pulse voltage used in the P-CVD process is the smallest one, that is −1.0 kV was almost approximate to the upper limit of the favorable range, whereas the electric resistivity of DLC coating layer formed when the pulse voltage is the largest, that is −20.0 kV was almost approximate to the lower limit of the favorable range. From these results, it has been found that the pulse voltage ranging from −1.0 kV to −20.0 kV should be applied in the P-CVD process in order to form DLC coating layer 4 having electric resistivity within the favourable range, that is from $10^8$ to $10^{13}$ $\Omega$-cm.

<Experiments 3>

The P-CVD process was carried out to form DLC coating layer 4 in like manner as in Experiments 1 except that the pulse voltage applied was −5 kV and the after-glow time was varied within a range of 70–250 microseconds. The electric resistivity of the DLC coating layers 4 of the resulting ESCs were measured, the results of which are shown in the following Table VII.

TABLE VII

| After-Glow Time ($\mu$ sec.) | 70 | 110 | 150 | 250 |
|---|---|---|---|---|
| Resistivity ($\Omega$-cm) | $1.4 \times 10^{11}$ | $3.0 \times 10^{12}$ | $4.3 \times 10^{12}$ | $2.2 \times 10^{13}$ |

As shown in Table VII, the electric resistivity of DLC coating layers 4 were all within favorable range; that is from $10^8$ to $10^{13}$ $\Omega$-cm. The results also suggest that the electric resistivity of DLC coating layer formed by P-CVD process correlates with the pulse voltage applied from the power source 15 in the P-CVD process. Further, the electric resistivity of DLC coating layer formed with the longest after-glow time, that is 250 microseconds, was almost approximate to the upper limit of the favorable range. Accordingly, the after-glow time of smaller than 250 microseconds should he applied in the P-CVD process in order to form DLC coating layer 4 having electric resistivity within the favorable range, that is from $10^8$ to $10^{13}$ $\Omega$-cm.

<Experiments 4>

When an ESC having the construction of FIG. 2 was formed in like manner as in Example 2, a DLC surface protection layers 7 were formed by a P-CVD process wherein a hydrocarbon compound to be used as a plasma source was variously changed in the same manner as in Experiments 1, the pulse voltage to be applied was varied in the same manner as in Experiments 2 and the after-glow time was varied in the same manner as in Experiments 3. The results were substantially the same as described before in conjunctions with Experiments 1–3. More specifically, in order that DLC layer 7 having electric resistivity within the favorable range, that is from $10^8$ to $10^{13}$ $\Omega$-cm is formed by a P-CVD process, the P-CVD process should be carried out by employing hydrocarbon compound (CxHy) of which (x) ranges 1–10 and (y) ranges 2–22 and applying the pulse voltage ranging from −1.0 kV to −20.0 kV with the after-glow time of smaller than 250 microseconds.

Although the present invention has been descried in conjunction with specific embodiments thereof, it is to be understood that the present invention is not limited to these embodiments and many modifications and variations may be made without departing from the scope and the it of the present invention as specifically defined in the appended claims. For example, though the insulating layer of the ESC in the foregoing examples, controls and experiments comprises graphite substrate 1 surrounded by a PBN insulator 2 (FIG. 1 and FIG. 2), it may comprise solely an insulating substrate of ceramic material such as oxides and nitrides. The conductive electrodes may be molybdenum (Mo), tantalum (Ta), tungsten (W) or any other metals having a high-melting point.

What is claimed is:

1. An electrostatic chuck for electrostatically clamping a workpiece to the chuck comprising an insulating layer, at least one conductive electrode superimposed upon or imbedded within the said insulating layer, a coating layer surrounding the said insulating layer and the said electrodes, and a source of voltage for generating chucking force adjacent to the said workpiece so as to clamp the said workpiece to a chucking surface of the chuck, the said coating layer consisting essentially of non-crystalline carbon and having electric resistivity ranging from $10^8$ to $10^{13}$ $\Omega$-cm.

2. An electrostatic chuck according to claim 1 wherein the said coating layer has thickness of at least 2.5 micrometers.

3. An electrostatic chuck according to claim 1 wherein the said coating layer is formed by a plasma chemical vapor deposition process.

4. An electrostatic chuck according to claim 1 wherein the said coating layer contains 15–26 atom % of hydrogen.

5. An electrostatic chuck for electrostatically clamping a workpiece to the chuck comprising an insulating layer, at least one conductive electrode superimposed upon or imbedded within the said insulating layer, a coating layer surrounding the said insulating layer and the said electrodes, a surface protection layer formed on at least one surface of the said coating layer and consisting essentially of non-crystalline carbon and having electric resistivity ranging from $10^8$ to $10^{13}$ $\Omega$-cm, and a source of voltage for generating chucking force adjacent to the said workpiece so as to clamp the said workpiece to a surface of the said surface protection layer.

6. An electrostatic chuck according to claim 5 wherein the said surface protection layer contains 15–26 atom % of hydrogen.

7. An electrostatic chuck for electrostatically clamping a workpiece to the chuck comprising an insulating layer, at least one conductive electrode superimposed upon or imbedded within the said insulating layer, a coating layer surrounding the said insulating layer and the said electrodes, and a source of voltage for generating chucking force adjacent to the said workpiece so as to clamp the said workpiece to a chucking surface of the chuck, the said coating layer consisting essentially of non-crystalline carbon and having electric resistivity rang from $10^8$ to $10^{13}$ Ω-cm, the said coating layer having an intensity ratio of 0.7–1.2, the said intensity ratio being defined as a ratio of an intensity at 1360 cm$^{-1}$ to another intensity at 1500 cm$^{-1}$ when the said coating layer is subjected to Raman spectroscopic analysis.

8. An electrostatic chuck according to claim 7 wherein the said coating layer has thickness of at least 2.5 micrometers.

9. An electrostatic chuck according to claim 7 wherein the said coating layer comprising non-crystalline carbon is formed by a plasma chemical vapor deposition process.

10. An electrostatic chuck according to claim 7 wherein the said coating layer contains 15–26 atom % of hydrogen.

11. An electrostatic chuck for electrostatically clamping a workpiece to the chuck comprising an insulating layer, at least one conductive electrode superimposed upon or imbedded within the said insulating layer, a coating layer surrounding the said insulating layer and the said electrodes, a surface protection layer formed on at least one surface of the said coating layer and consisting essentially of non-crystalline carbon and having electric resistivity ranging from $10^8$ to $10^{13}$ Ω-cm, and a source of voltage for generating chucking force adjacent to the said workpiece so as to clamp the said workpiece to a surface of the said surface protection layer, the said surface protection layer having an intensity ratio of 0.7–1.2, the said intensity ratio being defined as a ratio of an intensity at 1360 cm$^{-1}$ to another intensity at 1500 cm$^{-1}$ when the said coating layer is subjected to Raman spectroscopic analysis.

12. An electrostatic chuck according to claim 11 wherein the said surface protection layer contains 15–26 atom % of hydrogen.

13. A method of manufacturing an electrostatic chuck comprising the steps of:
   forming a predetermined pattern of conductive electrodes on at least one surface of an insulating layer; and
   subjecting a resulting product to a plasma chemical vapor deposition process wherein hydrocarbon (CxHy) of which (x) ranges 1–10 and (y) ranges 2–22 is introduced into a vacuum container and ionized therein by ionizing (plasma) process and ionized hydrocarbon is deposited on the surface of the said conductive electrodes by applying thereto a predetermined pulse voltage, so that the said conductive electrodes are coated with a coating layer consisting essentially of non-crystalline carbon and having electric resistivity ranging from $10^8$ to $10^{13}$ Ω-cm.

14. A method of manufacturing an electrostatic chuck comprising the steps of:
   forming a predetermined pattern of conductive electrodes on at least one surface of an insulating layer; and
   subjecting a resulting product to a plasma chemical vapor deposition process wherein hydrocarbon (CxHy) is introduced into a vacuum container and ionized therein by ionizing process and ionized hydrocarbon is deposited on the surface of the said conductive electrodes by applying thereto a pulse voltage ranging from −1 kV to −20 kV, so that the said conductive electrodes are coated with a coating layer consisting essentially of non-crystalline carbon and having electric resistivity ranging from $10^8$ to $10^{13}$ Ω-cm.

15. A method of manufacturing an electrostatic chuck comprising the steps of:
   forming a predetermined pattern of conductive electrodes on at least one surface of an insulating layer, and
   subjecting a resulting product to a plasma chemical vapor deposition process wherein hydrocarbon (CxHy) is introduced into a vacuum container and ionized therein by ionizing process and ionized hydrocarbon is deposited on the surface of the said conductive electrodes by applying thereto a predetermined pulse voltage within an after-glow time of smaller than 250 microseconds, so that the said conductive electrodes are coated with a coating layer consisting essentially of non-crystalline carbon and having electric resistivity ranging from $10^8$ to $10^{13}$ Ω-cm.

16. A method of manufacturing an electrostatic chuck comprising the steps of:
   forming a predetermined pattern of conductive electrodes on at least one surface of an insulating layer, and
   subjecting a resulting product to a plasma chemical vapor deposition process wherein hydrocarbon (CxHy) of which (x) ranges 1–10 and (y) ranges 2–22 is introduced into a vacuum container and ionized therein by ionizing process and ionized hydrocarbon is deposited on the surface of the said conductive electrodes by applying thereto a pulse voltage a from −1 kV to −20 kV within an after-glow time of smaller than 250 microseconds, so that the said conductive electrodes are coated with a coating layer consisting essentially of non-crystalline carbon and having electric resistivity ranging form $10^8$ to $10^{13}$ Ω-cm.

17. A method of manufacturing an electrostatic chuck comprising the steps of:
   forming a predetermined pattern of conductive electrodes on at least one surface of an insulating layer;
   coating the s conductive electrodes with a coating layer; and
   subjecting a resulting product to a plasma chemical vapor deposition process wherein hydrocarbon (CxHy) of which (x) ranges 1–10 and (y) ranges 2–22 is introduced into a vacuum container and ionized therein by ionizing process and ionized hydrocarbon is deposited on the surface of the said coating layer by applying thereto a predetermined pulse voltage, so that the said coating layer is coated with a surface protection layer consisting essentially of non-crystalline carbon and having electric resistivity ranging from $10^8$ to $10^{13}$ Ω-cm.

18. A method of manufacturing an electrostatic chuck comprising the steps of:
   forming a predetermined pattern of conductive electrodes on at least one surface of an insulating layer;
   coating the said conductive electrodes with a coating layer; and
   subjecting a resulting product to a plasma chemical vapor deposition process wherein hydrocarbon (CxHy) is introduced into a vacuum container and ionized therein by ionizing process and ionized hydrocarbon is deposited on the surface of the said coating layer by applying thereto a pulse voltage ranging form −1 kV to −20 kV, so that the said coating layer is coated with a surface protection layer consisting essentially of non-crystalline carbon and having electric resistivity ranging from $10^8$ to $10^{13}$ Ω-cm.

19. A method of manufacturing an electrostatic chuck comprising the steps of:
   forming a predetermined pattern of conductive electrodes on at least one surface of an insulating layer;
   coating the said conductive electrodes with a coating layer; and
   subjecting a resulting product to a plasma chemical vapor deposition process wherein hydrocarbon (CxHy) is introduced into a vacuum container and ionized therein by ion process and ionized hydrocarbon is deposited on the surface of the said coating layer by applying thereto a predetermined pulse voltage within an after-glow time of smaller than 250 microseconds, so that the said coating layer is coated with a surface protection layer essentially of non-crystalline carbon and having electric resistivity ranging from $10^8$ to $10^{13}$ $\Omega$-cm.

20. A method of manufacturing an electrostatic chuck comprising the steps of:

forming a predetermined pattern of conductive electrodes on at least one surface of an insulating layer;

coating the said conductive electrodes with a coating layer; and subjecting a resulting product to a plasma chemical vapor deposition process wherein hydrocarbon (CxHy) of which (x) ranges 1–10 and (y) ranges 2–22 is introduced into a vacuum container and ionized therein by an ionizing process and ionized hydrocarbon is deposited on the surface of the said coating layer by applying thereto a pulse voltage ranging from −1 kV to −20 kV within an after-glow time of smaller than 250 microseconds, so that the said coating layer is coated with a surface protection layer consisting essentially of non-crystalline carbon and having electric resistivity ranging from $10^8$ to $10^{13}$ $\Omega$-cm.

* * * * *